United States Patent
Wittmann et al.

(10) Patent No.: US 7,173,953 B2
(45) Date of Patent: Feb. 6, 2007

(54) ANTI-REFLECTION COATINGS FOR SEMICONDUCTOR LASERS

(75) Inventors: Andreas Wittmann, Kilchberg (CH); Martin Gotza, Zurich (CH); Michael Solar, Zurich (CH); Ernst-Eberhard Latta, Adliswil (CH); Tim Kellner, Zurich (CH); Martin Krejci, Zurich (CH)

(73) Assignee: Bookham Technology plc, Northamptonshire (GB)

( * ) Notice: Subject to any disclaimer, the term of this patent is extended or adjusted under 35 U.S.C. 154(b) by 267 days.

(21) Appl. No.: 10/735,375

(22) Filed: Dec. 12, 2003

(65) Prior Publication Data

US 2004/0151226 A1 Aug. 5, 2004

Related U.S. Application Data

(63) Continuation-in-part of application No. 09/993,824, filed on Nov. 6, 2001, now abandoned.

(51) Int. Cl.
*H01S 5/00* (2006.01)
*H01L 33/00* (2006.01)

(52) U.S. Cl. ............................ 372/49; 257/98
(58) Field of Classification Search .................. 372/49, 372/43, 99; 257/98, 102
See application file for complete search history.

(56) References Cited

U.S. PATENT DOCUMENTS

| | | | |
|---|---|---|---|
| 6,285,700 B1 | 9/2001 | Ueno et al. | |
| 6,380,611 B1 | 4/2002 | Yin et al. | |
| 6,455,876 B1 * | 9/2002 | Kikawa et al. | 257/98 |
| 6,541,164 B1 * | 4/2003 | Kumar et al. | 430/5 |
| 6,590,920 B1 * | 7/2003 | McElhinney et al. | 372/49.01 |
| 6,677,618 B1 * | 1/2004 | Horie et al. | 257/94 |
| 6,717,971 B2 * | 4/2004 | Marsh et al. | 372/50.1 |
| 2002/0020847 A1 * | 2/2002 | Horie et al. | 257/98 |
| 2002/0113243 A1 * | 8/2002 | Kikawa et al. | 257/98 |

OTHER PUBLICATIONS

Stanley Wolf et al., 1986, Lattice Press, vol. 1 : Process Technology , p. 191-194.*

* cited by examiner

*Primary Examiner*—Don Wong
*Assistant Examiner*—Hung Tran Vy
(74) *Attorney, Agent, or Firm*—Renner, Otto, Boisselle & Sklar, LLP (57) ABSTRACT

The present invention concerns an anti-reflection coating for semiconductor lasers, in particular a coating on the laser facet with advantageous properties resulting in improved reliability and reduced probability of specific breakdowns, especially so-called catastrophic optical damages (CODs). It is a quarter-wave coating with a predetermined reflectivity, preferably between 0 and 10% and consists of or comprises $SiN_x$:H. It is preferably applied by a Plasma-Enhanced Chemical Vapor Deposition (PE-CVD) process whose process parameters are controlled such that a desired optical thickness and refractive index of the coating are achieved. The PE-CVD process may be controlled to result in an Si/N ratio between about 0.5 and 1.5 and/or to produce a coating of essentially amorphous $SiN_x$:H whose density approaches the density of crystalline $Si_3N_4$.

17 Claims, 13 Drawing Sheets

Process parameters

| Reflectivity R | index of refraction n | Substrate Temperature $T_s$ (°C) | Pressure P (Torr) | Plasma Power $L_{plasma}$ (W) | nitrogen flux $n_{[N2]}$ (sccm) | ammonia flux $n_{[NH3]}$ (sccm) | silane flux(*) $n_{[SiH4]}$ (sccm) |
|---|---|---|---|---|---|---|---|
| 0.05% | 1.86 | 300 | 1.4 | 25 | 35 | 18 | 236 |
| 1% | 2.01 | 300 | 1.4 | 25 | 35 | 13 | 403 |
| 4% | 2.23 | 300 | 1.4 | 25 | 35 | 8.5 | 491 |
| 1%(**) | 1.83 | 300 | 1.4 | 20 | 330 | 11.2 | 300 |

(*) precursor gas of 2% SiH4 diluted in Helium
(**) conventional non-λ/4 coating

ANTI-REFLECTION COATINGS FOR SEMICONDUCTOR LASERS

CROSS-REFERENCE TO RELATED APPLICATION

This application is a continuation-in-part of U.S. patent application Ser. No. 09/993,824, filed Nov. 6, 2001 now abandoned, the entire disclosure of which is incorporated by reference.

FIELD OF THE INVENTION

The present invention relates to semiconductor lasers in general, i.e. to laser diodes, and in particular to anti-reflection coatings therefor.

BACKGROUND

In semiconductor laser diodes, high power densities at the waveguide-to-mirror or waveguide-to-coating interface are usually considered responsible for a gradual degradation close to the facet. In addition, the maximum extractable intensity at the physical interface semiconductor-to-coating appears to be limited because of occurring breakdowns, so-called catastrophic optical damages (CODs) which are related to crystal defects in the semiconductor.

There have been many efforts to increase the maximum output power of semiconductor lasers.

Thompson in U.S. Pat. No. 3,943,462, "Antireflection coatings for injection lasers" and Gasser, Latta, Jakubowicz, Dietrich, and Roentgen in U.S. Pat. No. 5,940,424, "Semiconductor laser and method for making the same", for example, describe laser diodes with multiple layers of dielectrics at the waveguide-to-mirror interface to reduce the power density at this interface.

For various reasons, antireflection mirrors or coatings with an optical thickness of $\lambda/4$, where $\lambda$ is the emitting wavelength, have become important in semiconductor lasers. In the following, these coatings will be labelled quarter-wave coating, or QW coating.

Ueno et al. disclose in U.S. Pat. No. 6,285,700 how a phase-shifted $\lambda/4$ antireflection mirror, a phase-shifted QW coating, may help to increase the level at which the so-called catastrophic optical damage (COD) of semiconductor lasers occurs.

One important advantage of QW coatings is that their reflectivity is rather insensitive against thickness and wavelength deviations. This simplifies the manufacturing process insofar as the high uniformity and repeatability required for coatings with optical thickness other than $\lambda/4$, i.e. QW, is often difficult to achieve.

A special application of QW coatings are uncooled semiconductor lasers with an external cavity such as amplifiers. These lasers usually have antireflection coatings with a reflectivity close to zero (0.2% or less). Such a low reflectivity can only be achieved if the optical thickness of the coating is equal to $\lambda/4$. As a result of this, the diffraction index of the coating must be as close as possible to $\sqrt{n_{\mathit{eff}}}$, where $n_{\mathit{eff}}$ is the effective diffraction index of the light-emitting laser facet.

The reflectivity of a semiconductor laser facet is a function of the wavelength of the emitted light, the effective refractive index of the light-emitting facet area, and the thickness and the diffraction index of the coating or coatings deposited on the facet. In practice, the reflectivity is adjusted by controlling the properties of the coating since wavelength and refractive index of the emitting facet region are predetermined. Applying multiple layers of coatings leads to a highly undesirable complexity of the production process, therefore single layer coatings are preferred. For QW single layer coatings, the thickness is predetermined, therefore the reflectivity has to be adjusted by the refractive index of the coating material. The present invention shows how to adjust the refractive index for a material system so that QW coatings with a reflectivity between 0 and 10% are obtained in a reliable and easily controllable way.

SUMMARY OF THE INVENTION

In general, the present invention concerns a coating of a predetermined, controllable reflectivity, preferably between 0 and 10%, on a facet of a semiconductor laser and a method for manufacturing such a coating.

The manufacturing process is controlled in such a way that the coating is formed as or comprises a single or multi-layer structure on the laser facet and has a resulting optical thickness of one quarter of the wavelength emitted by the laser, i.e. is a QW coating.

The coating consists of or comprises essentially amorphous $SiN_x$:H, wherein x is a real number >0. It may also include traces of oxygen which is not required in the coating, but sometimes unavoidable.

This coating is preferably applied by a Plasma-Enhanced Chemical Vapor Deposition (PE-CVD) process. The process parameters are controlled such that the desired thickness and refractive index of the coating are achieved. Usually, the coating's refractive index is tuned to be higher than the refractive index of the laser facet to achieve the desired phase-shifting.

The main factor that decisively influences the refractive index of the $SiN_x$:H layer according to the invention is the ratio of Si to N ("Si/N ratio" in the following) in the $SiN_x$:H layer. But there is a second factor that exerts some influence, at least under certain conditions: the microstructure of the $SiN_x$:H layer.

It is believed that the two factors are related to each other. Since both the Si/N ratio and the microstructure are affected by the manufacturing process for the $SiN_x$:H layer, the control of this process is the crucial issue to obtain the desired properties of the $SiN_x$:H layer.

Specifically, the PE-CVD process is controlled to result in an Si/N ratio between about 0.3 and 1.5.

Advantageously, the PE-CVD process is further controlled to produce an essentially homogeneous coating of $SiN_x$:H whose density approaches the density of crystalline $Si_3N_4$.

For any specific semiconductor laser, e.g. a GaAs/AlGaAs-based laser, the process parameters of the PE-CVD process are preferably so adjusted that a refraction index of the coating of at least $\sqrt{n_{sub}}$ is produced, wherein $n_{sub}$ is the effective refractive index of the light emitting area of the laser facet.

To achieve any of the above, the controlled process parameters of the PE-CVD process include:

- the gaseous components and their relative ratios forming the plasma,
- the power of said plasma,
- the pressure, and
- the substrate temperature at which said PE-CVD process is executed.

The controlled process parameters of the PE-CVD process may further include:

the total flux of the gaseous components and
the addition of H as precursor gas.

A semiconductor laser according to the invention with a given wavelength, including its variations and modifications, thus preferably includes a coating on its emission facet with a predetermined reflectivity, said coating comprising $SiN_x$:H whose Si/N ratio is between 0.3 and 1.5.

Preferably, the coupling of the standing wave produced in the laser semiconductor body and the coating layer occurs at the minimum of said standing wave.

The invention also concerns an optical transmitter and/or an optical amplifier and/or an air-packaged optical unit with an input and an output and optical means between said input and said output, said optical means comprising a semiconductor laser according to any of the above device features.

Further features and inventive aspects may be deduced from the appended claims. Also any of the inventive aspects, features, or preferences above and/or in the claims may be combined as appropriate, as will be apparent to a person skilled in the art.

BRIEF DESCRIPTION OF THE DRAWINGS

In order to show how the invention may be carried out, embodiments of the invention are described below by way of example and with reference to the accompanying drawings in which.

DETAILED DESCRIPTION OF THE INVENTION

Figure 1:
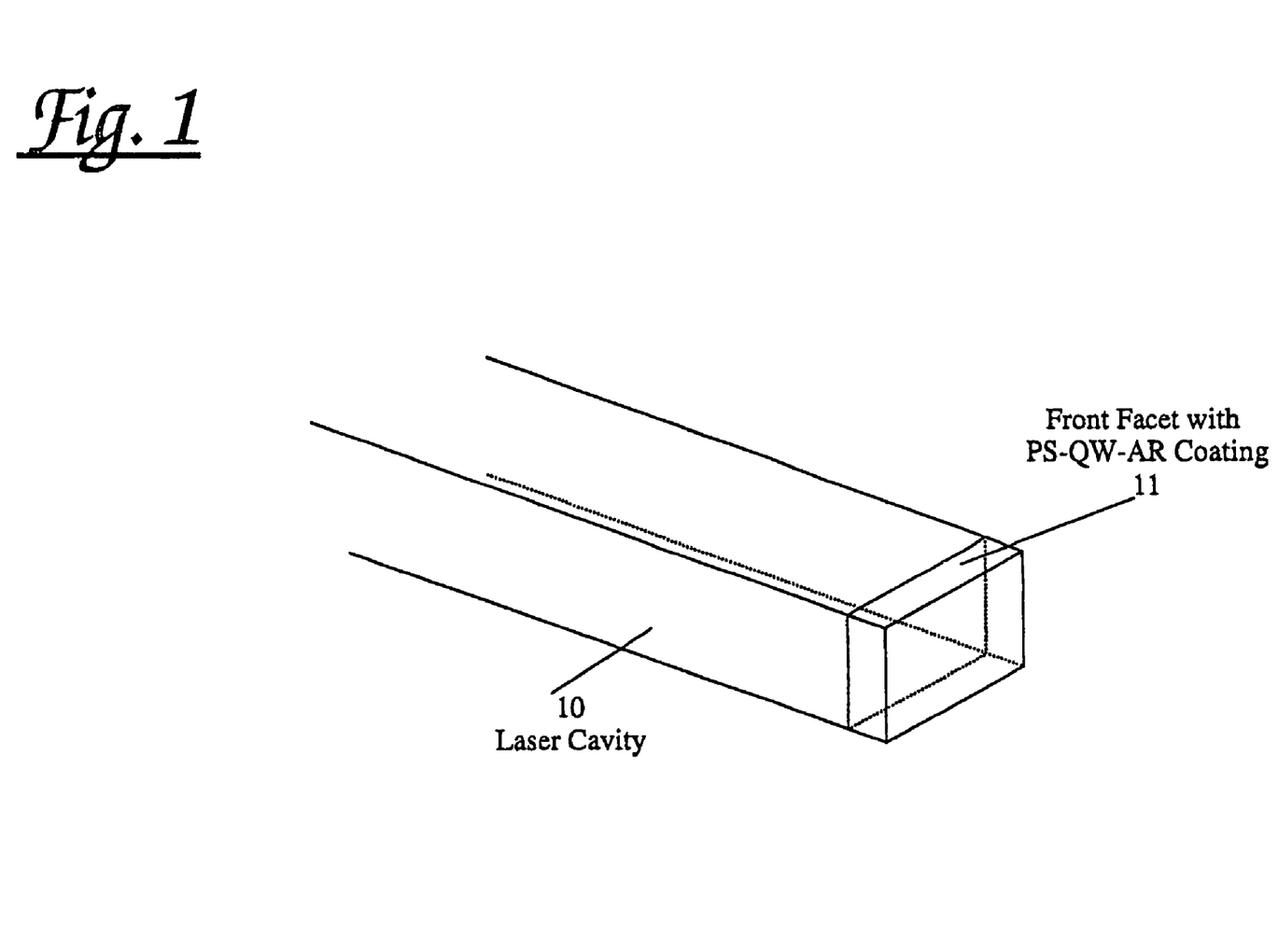
FIG. 1 shows a schematic diagram of a semiconductor laser with a facet coating.

FIG. 1 shows a schematic diagram of a semiconductor laser comprising a laser cavity 10 with a front facet coating 11. The thickness of the front facet coating is chosen to be a quarter of the laser wavelength, coating, and the optical index is varied to adjust the reflectivity. To obtain a reflectivity R one has to adjust the refractive index of the QW coating to $$n_{1,2} = \sqrt{n_{sub}} \cdot \sqrt{\frac{1 \pm \sqrt{R}}{1 \mp \sqrt{R}}},$$

wherein $n_1$ is the phase-shifting refractive index of the coating, $n_2$ is its in-phase refractive index, and $n_{sub}$ is the effective refractive index of the light-emitting area of the laser facet.

The invention uses a phase-shifting antireflection mirror or coating, and for such a phase-shifting coating, the refraction index has to be at least $\sqrt{n_{sub}}$, i.e. for GaAs semiconductor lasers and a reflectivity between 0 and 4%, a refraction index between 1.83 and 2.24 is required.

Figure 2:
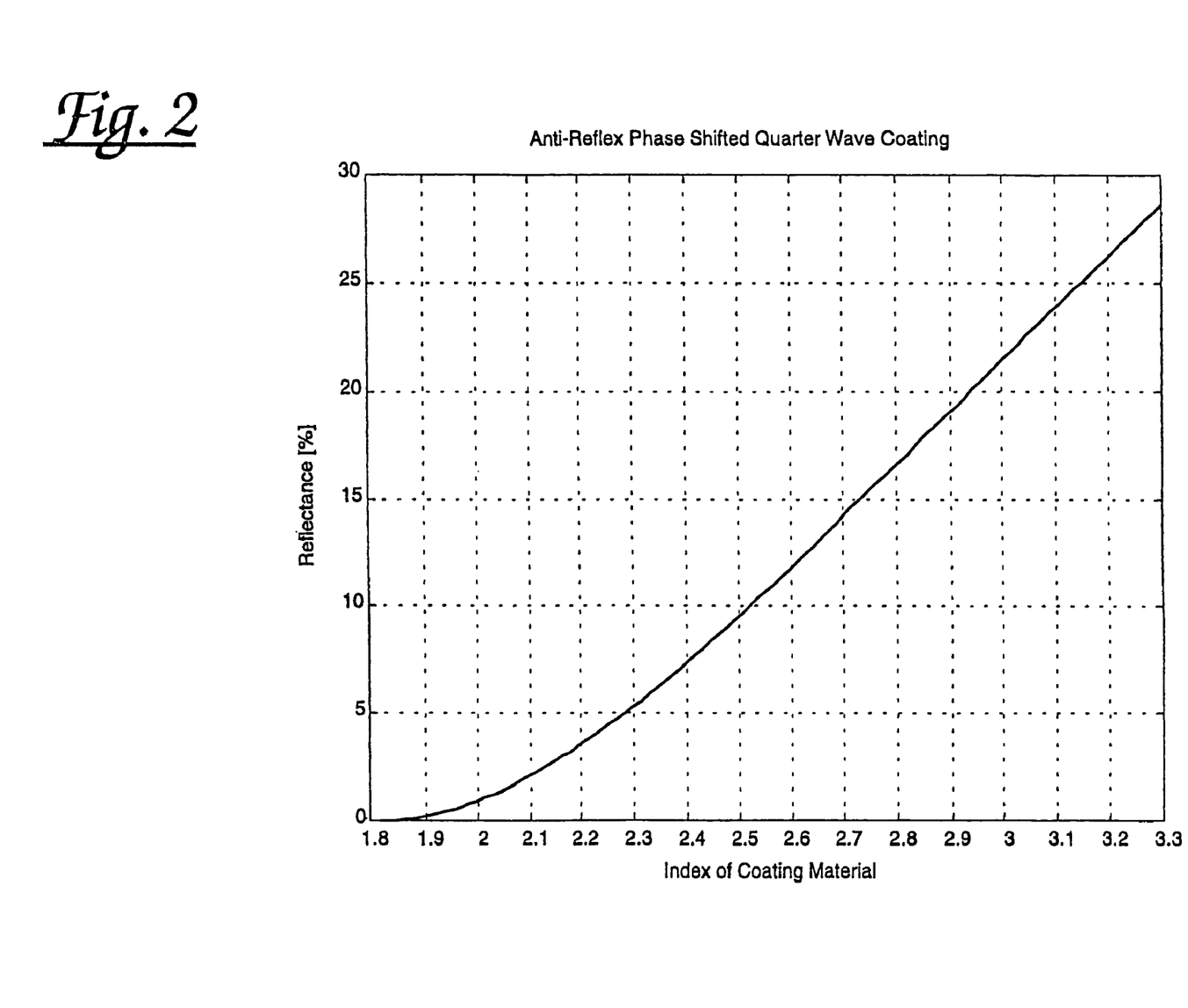
FIG. 2 shows the reflectivity in % over the refractive index of a coating material for a QW coating.

FIG. 2 shows a graph of the refractive index needed for a target reflectivity of a QW coating. Advantageously, coupling takes place at the minimum of the standing wave and therefore optical power at the semiconductor/coating interface is minimized. Furthermore, the target reflectivity is insensitive against thickness variations and fluctuations of the emitted wavelength.

The method can be applied in a high-throughput, large-scale production due to the simplicity and stability of the design using a single QW coating layer.

The invention was demonstrated by comparing a conventional non-QW front facet coating of 1490 Å thickness having a refractive index of 1.815 with different QW front facet coatings having a refractive index between 1.83 and 2.24

The coating was a $SiN_x$:H layer grown by PECVD according to the invention. Generally, any coating can be used for which the refractive index is adjustable. When using a technology where discrete refractive indices occur, the invention may be used for a discrete reflectivity set.

Figure 3:
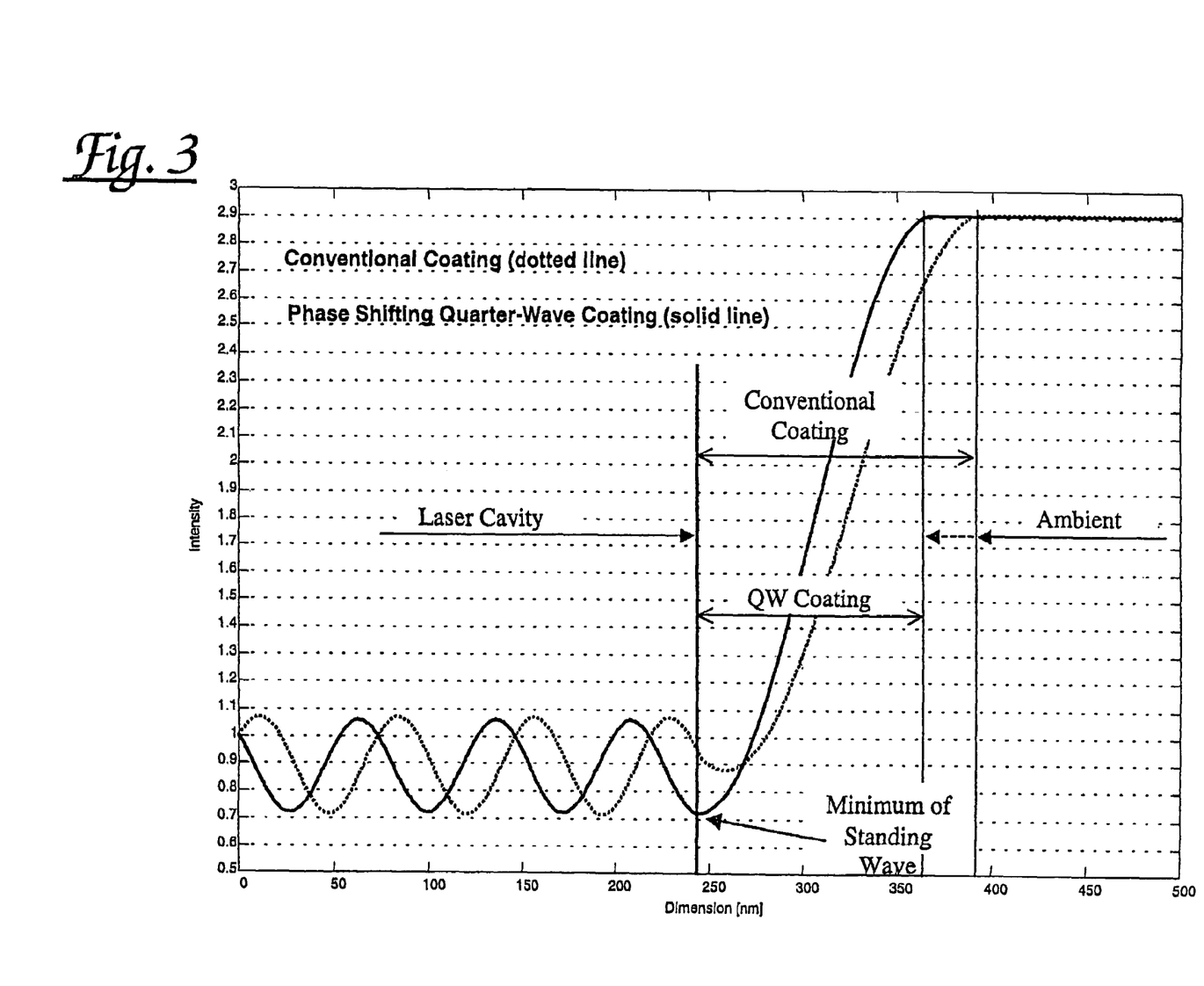
FIGS. 3a, 3b illustrate the target reflectivity of a conventional coating compared to a coating according to the present invention.

FIG. 3 shows the intensity distribution of the standing light wave in the front facet region of lasers with phase-shifting QW (solid line) and conventional non-QW (dotted line) coatings. For the phase-shifting QW coating, the intensity curve has a minimum at the semiconductor/coating interface. Therefore damages in the region of the semiconductor surface related to the optical power of the emitting light will be smaller for phase-shifting QW coatings.

Figure 4A:
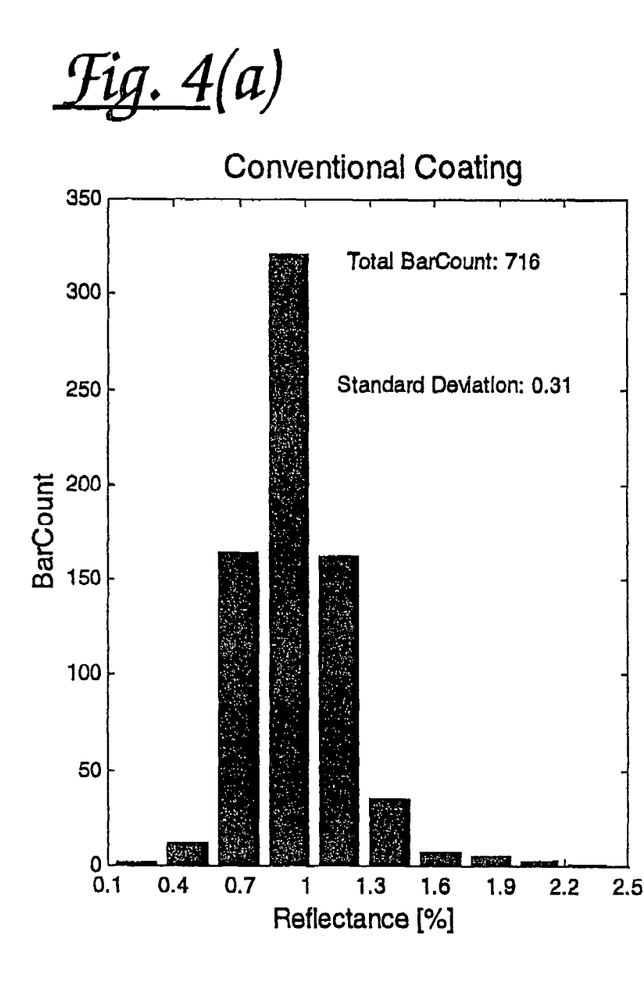
FIGS. 4a, 4b show graphically the dependence of reflectivity on thickness variation compared for known coatings and a coating according to the present invention.
Figure 4B:
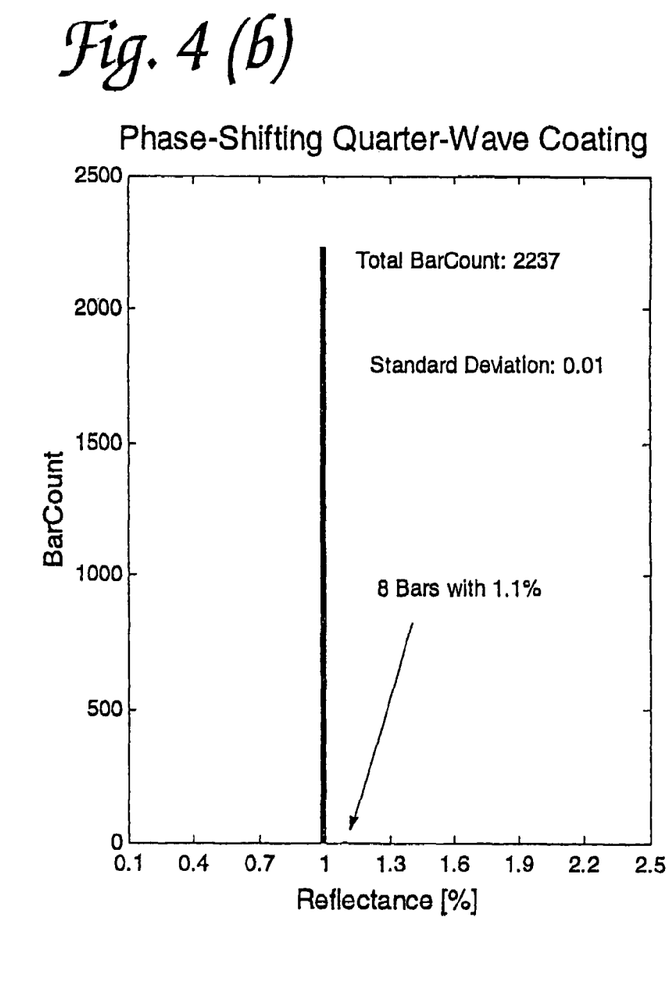

FIGS. 4a and 4b show the reflectivity distribution of manufactured batches of non-QW (4a) and QW coatings (4b). The target reflectivity in both cases was 1%. The PE-CVD deposition was carried out in the same chamber and under similar conditions. The standard deviation from the target reflectivity is much smaller for the QW coating than for the conventional coating. This behavior is related to the nature of QW coatings as explained in relation to FIG. 5 below.

Figure 5:
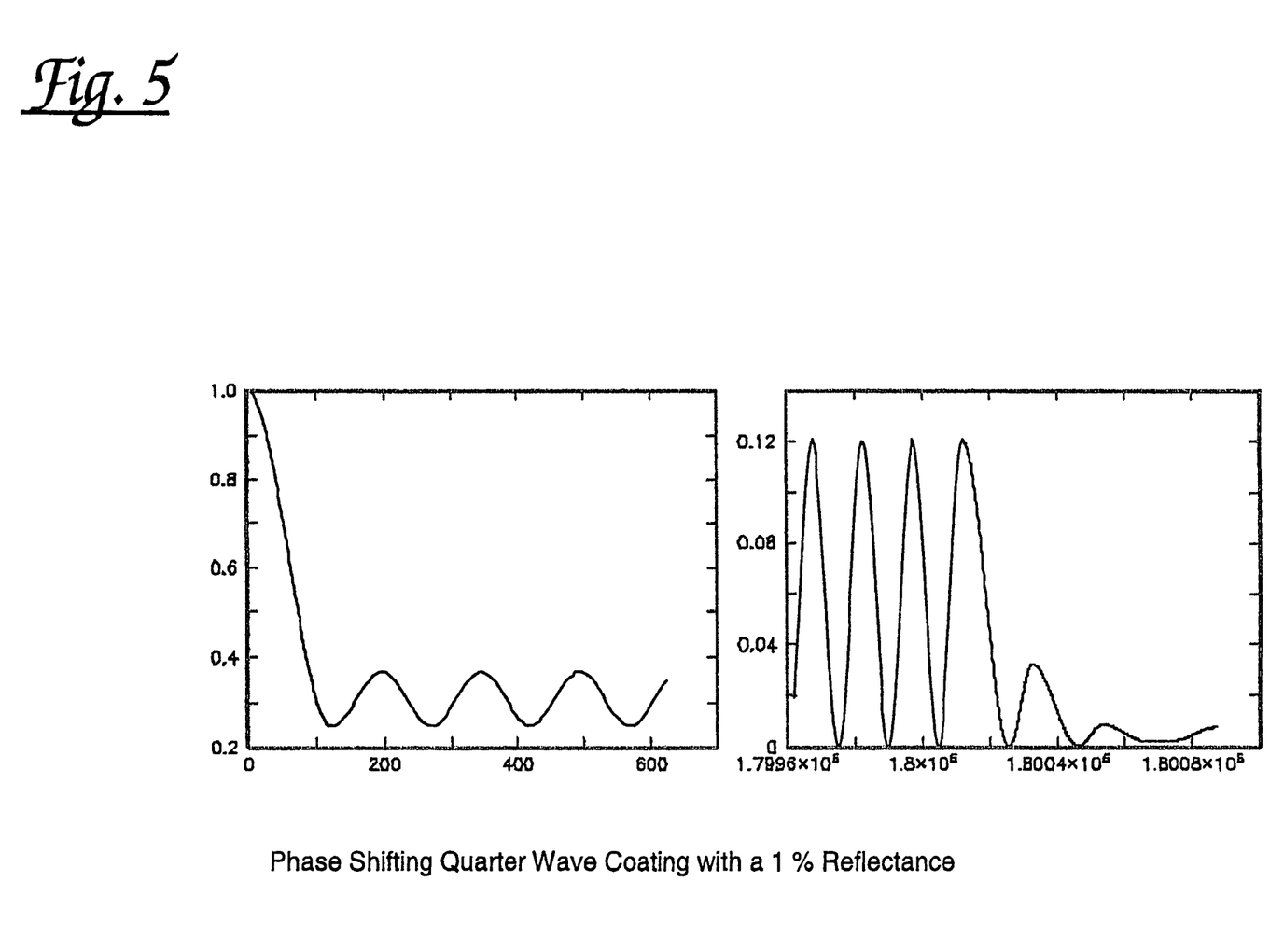
FIGS. 5, 6 illustrate examples of intensity distributions for different coatings according to the present invention.
Figure 6:
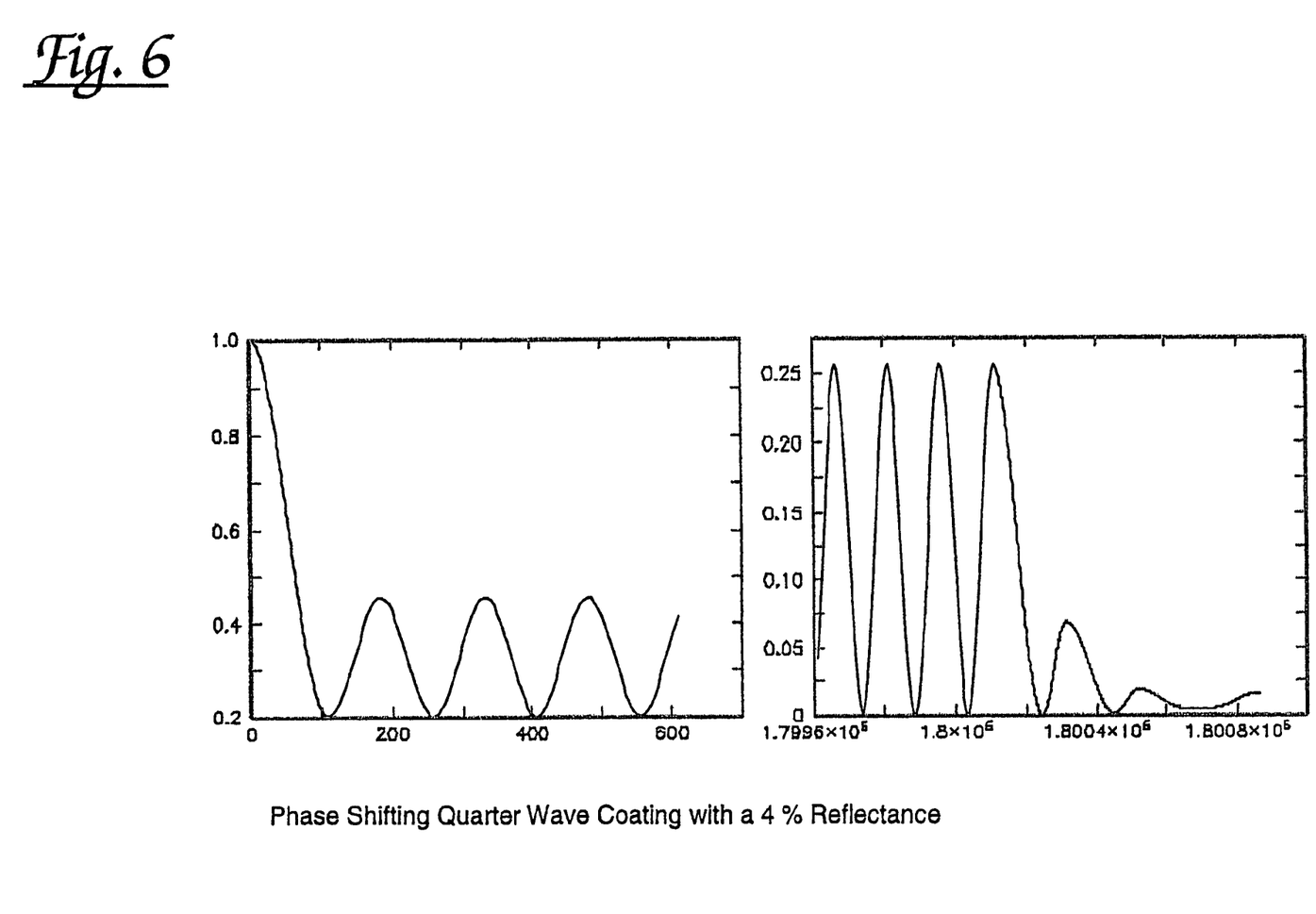

FIGS. 5 and 6 illustrate the influence of thickness and wavelength on the target reflectivity for a conventional non-QW prior art coating and a phase-shifting QW coating according to the invention.

The greatest influence on the reflectivity has a thickness deviation from the target thickness. In a process according to the invention, the thickness inhomogeneity per run is typically 40 Å. For a target reflectivity of one percent, this inhomogeneity has a significantly different impact on the reflectivity depending on whether the coating has an optical thickness of λ/4, i.e. QW, or not. A thickness variation of 40 Å leads to a reflectivity variation of 120% for the conventional non-QW coating and a variation of only 10% for a QW coating.

In FIG. 5, the two plots represent the intensity normalized for the front intensity, whereby the front facet is displayed at the left. As can be seen, the application of the phase-shifting QW coating leads to an intensity reduction of about 30%.

As also visible from FIG. 5, the reflectivity of a non-QW coating depends strongly on the wavelength variation, whereas the reflectivity of a QW coating changes only little within the plotted wavelength range.

In FIG. 6, the two plots represent the intensity normalized for the front intensity. Again, the front facet is displayed in the left plot. The application of the phase-shifting QW coating leads to an intensity reduction of approximately 55%.

Figure 7:
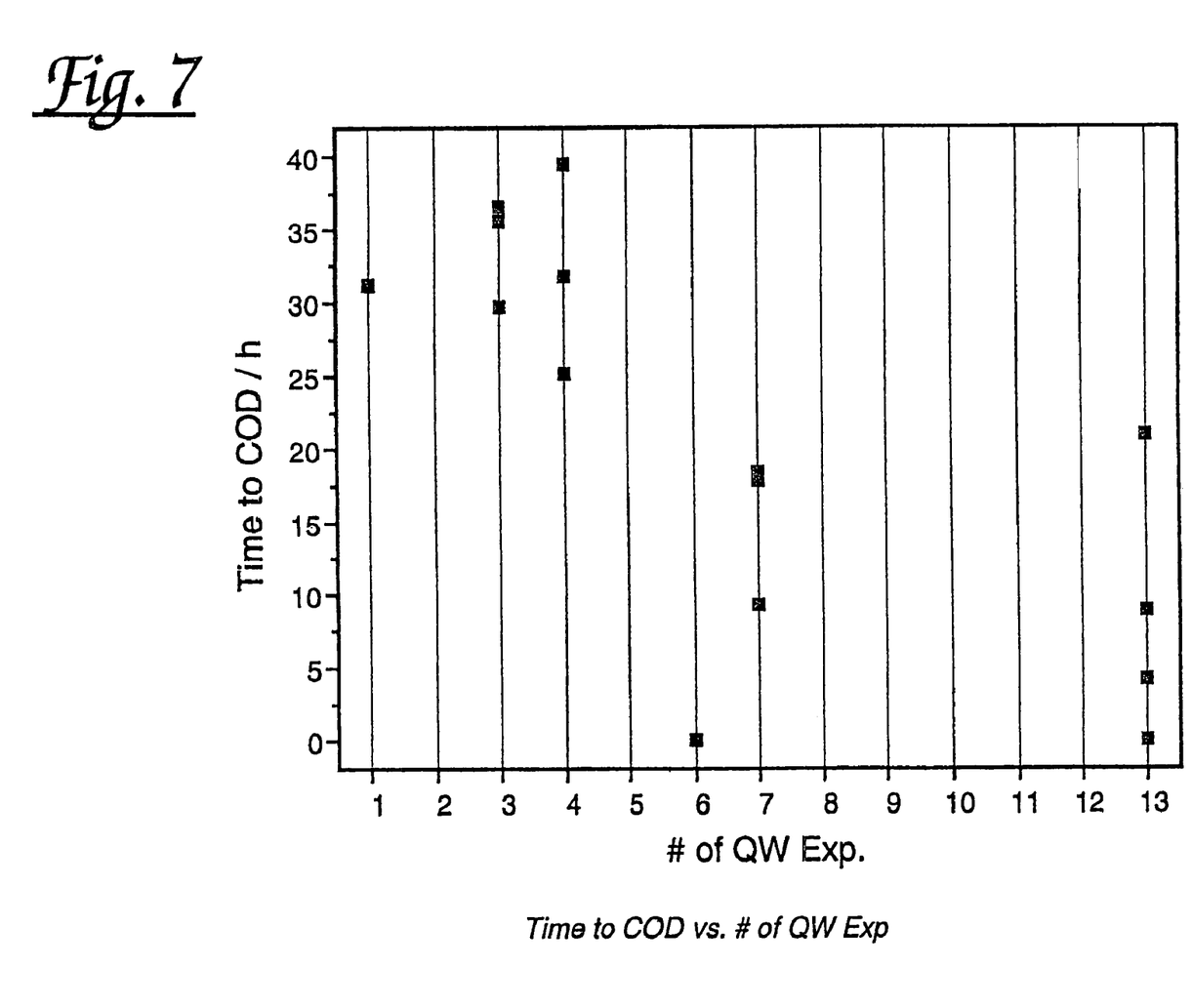
FIG. 7 shows experimental data relating to the time until the occurrence of COD of various lasers.

FIG. 7 shows experimental data of a pulsed-time-to-COD laser test. The test was carried out at −40° C. with 2.5 A rectangular pulses having a pulse width 5 s and a 4% duty cycle. Six lasers with a conventional non-QW coating (experiment 13) and sixteen lasers with different phase-shifting QW coatings (experiments 1 to 12) were tested. Five out of the six lasers from the non-QW population failed within the first 10 hours of the COD test. The time-to-failure for most of the lasers with a phase-shifting QW coating was significantly higher: twelve out of the sixteen lasers survived a test period of 25 hours or more. The low time-to failure of the laser of experiment 7 appears to be accidental and may be explained by a facet damage possibly caused by adverse deposition conditions, e.g. excessive plasma power.

The new front mirror coating according to the invention is developed with the intention to minimize the influence of coating thickness and wavelength on the reflectivity. As a result, the reflectivity distribution compared with a typical non-QW coating is reduced from +/−0.8 to +0.2/−0.01% of the target reflectivity. In addition, the dependency on wavelength is negligible. This is a particular advantage for high throughput production lines since it is rather difficult to maintain the frequency of the lasers absolutely constant.

Further, the design results in a high reflectivity index to take advantage of reducing the laser intensity at the facet to zero. Phase-shifted QW coatings according to the invention show a significant higher COD level, which is believed to be due to this advanced design. Reliability data show an equal or even better reliability for lasers with a phase-shifted QW coating compared to a conventional coating.

Also, the reflectivity is not only a function of coating thickness and refractive index, but also a function of the wavelength of the emitted light. In other words, a deviation from the target wavelength affects the reflectivity. This effect complicates high throughput production, particularly when multiple cells, differing in wavelength, are coated in the same coating run. Therefore, a negligible wavelength dependency is required for the reflectance of the coating.

The QW coating design chosen reduces the dependency of the reflectivity on wavelength and layer thickness. In contrast to previous mirror design, the QW coating is designed to adapt the reflectance by refractive index instead of coating thickness.

New product generations require a low front mirror reflectivity, thus, a reduction of reflectivity distribution/deviation is needed to satisfy customer specifications. The reflectivity deviation is mainly governed by the strong dependency of the reflectance on a thickness deviation.

Figure 8:
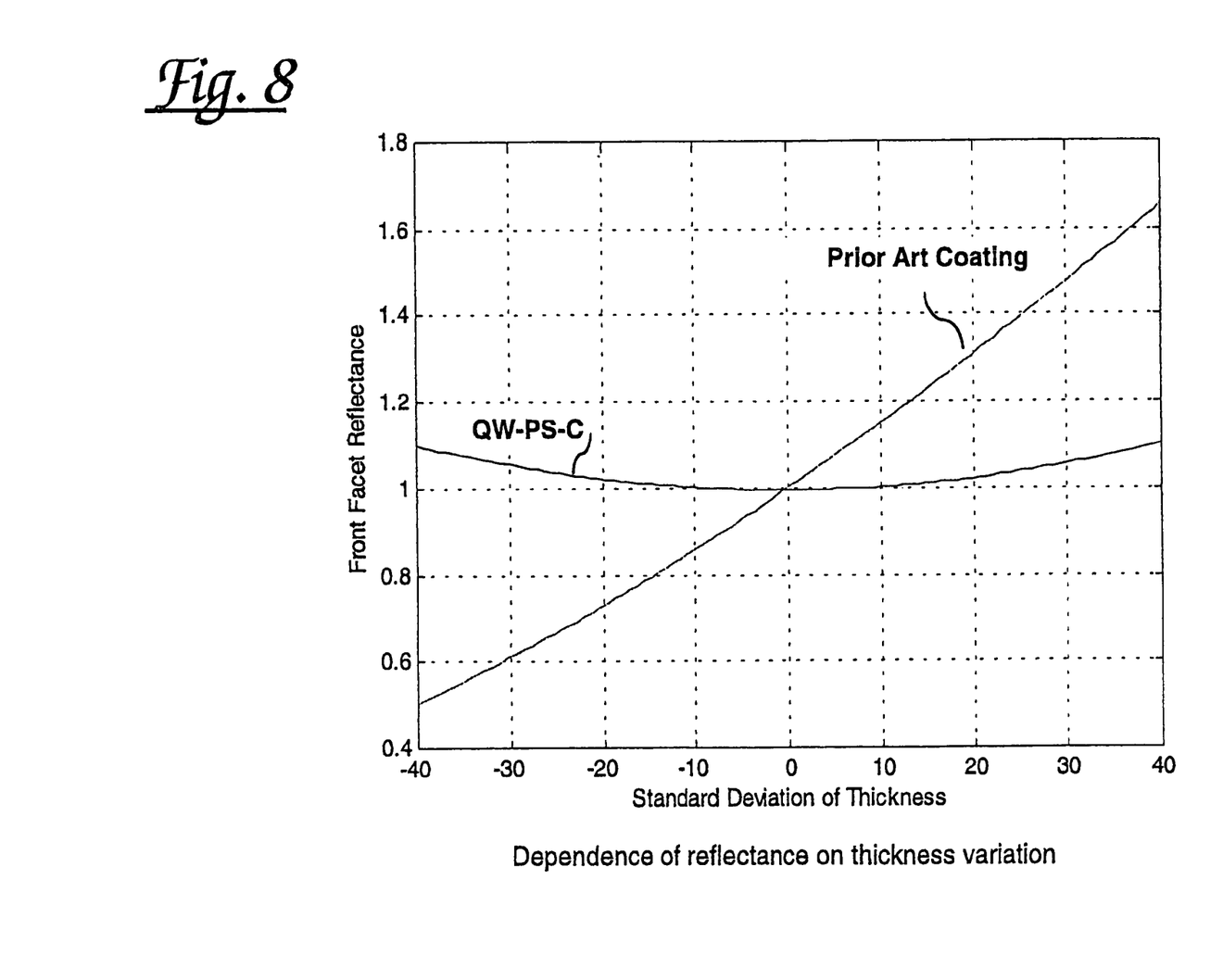
FIG. 8 shows graphically a comparison of reflectivity over thickness variation for known coatings and a coating according to the present invention.
Figure 9:
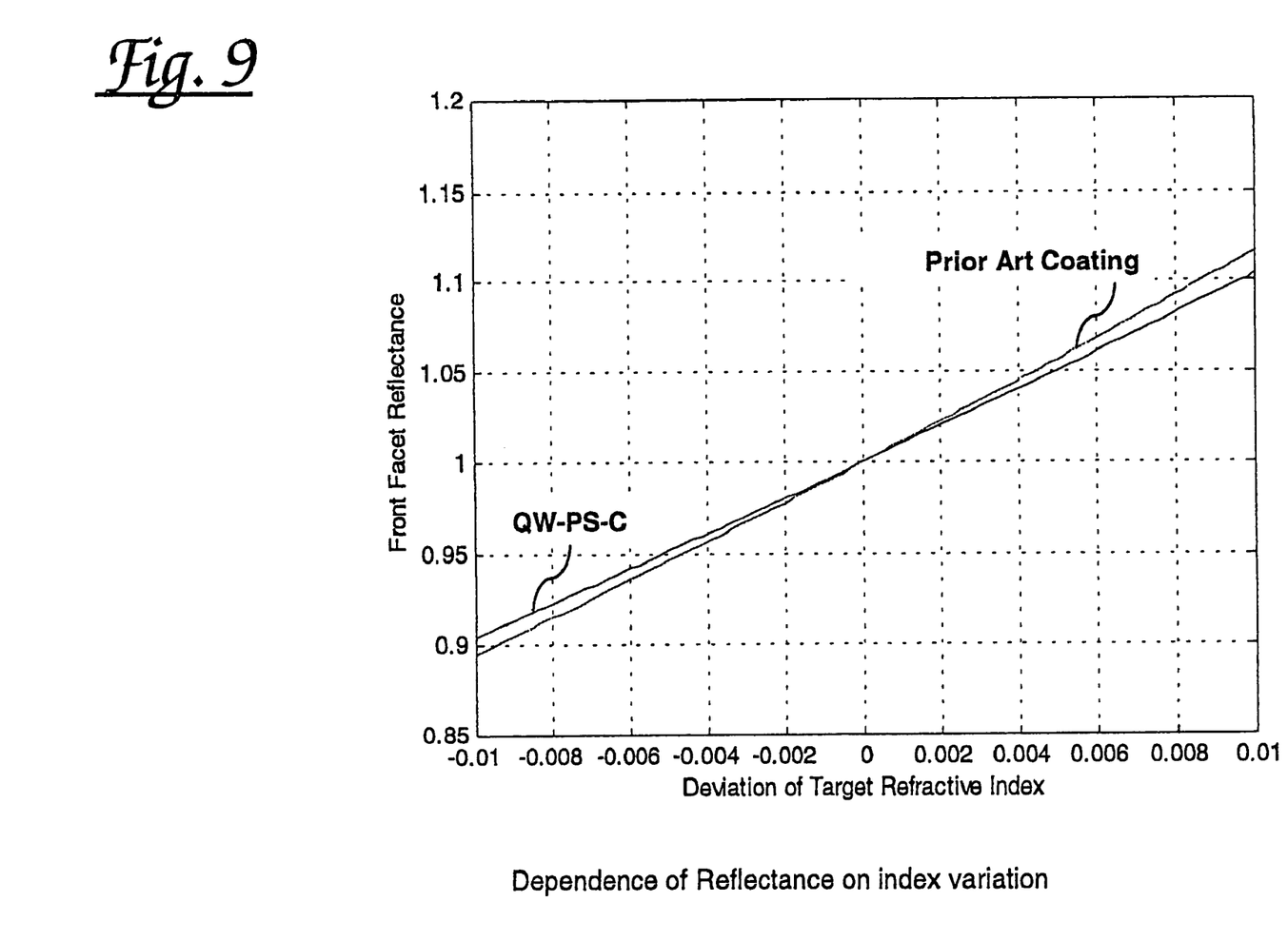
FIG. 9 shows graphically a comparison of reflectivity over refraction index variation for known coatings and a coating according to the present invention.
Figure 10:
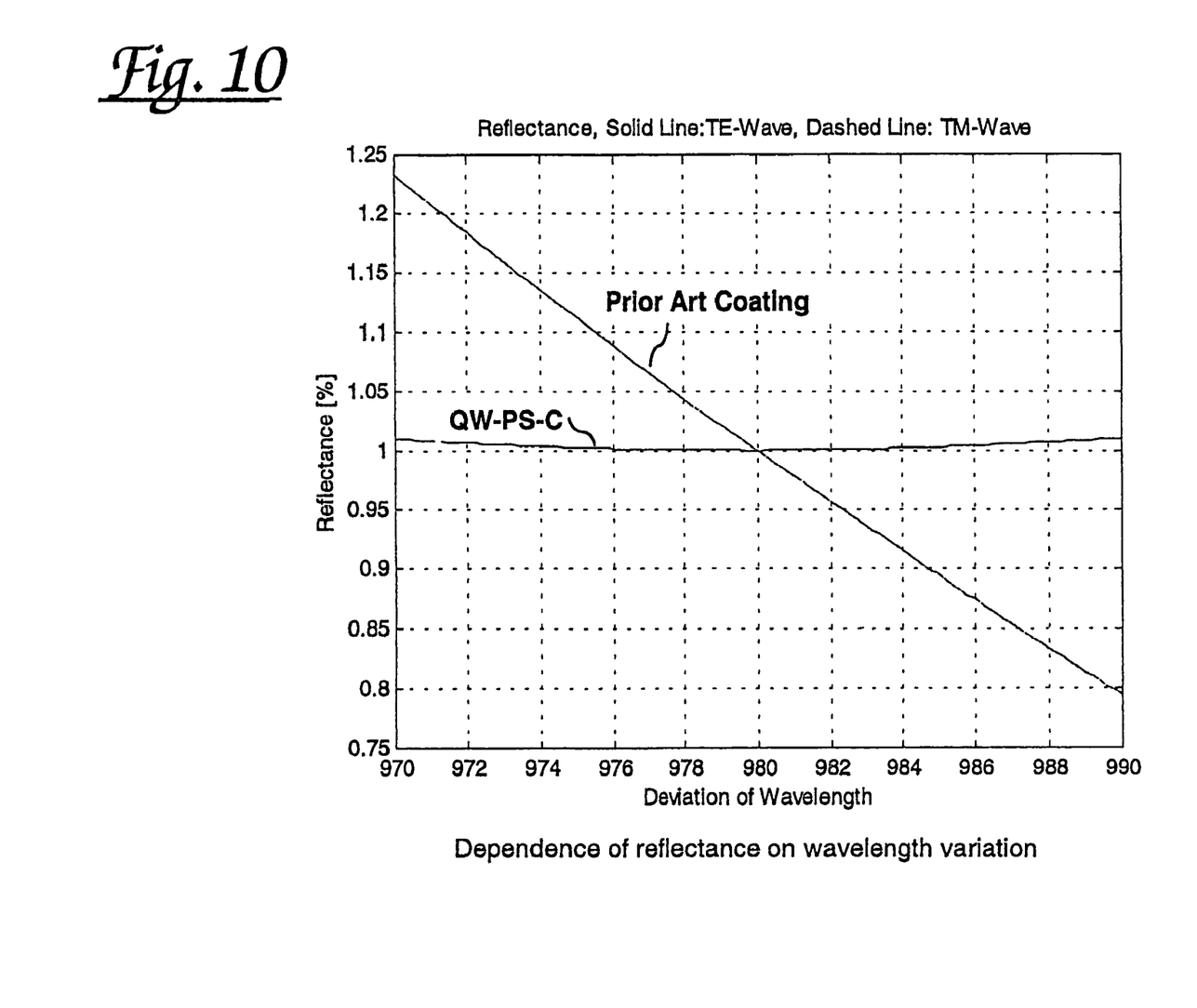
FIG. 10 shows graphically a comparison of the reflectivity over wavelength variation for known coatings and a coating according to the present invention.

FIGS. 8 to 10 show the influences of thickness, refractive index, and wavelength on the target reflectivity plotted over the standard deviation of a batch of manufactured lasers. In FIGS. 8 to 10, QW-PS-C always identifies the phase-shifting QW coating according to the present invention.

The greatest influence on the reflectivity has a thickness deviation, i.e. the deviation from the target thickness. The range of the abscissa in FIG. 8 is about the standard thickness deviation (in Ångstrom) over an area of 2.5 $cm^2$ of one PE-CVD $SiN_x$:H deposition run. This area corresponds approximately to the deposition area required for higher volume production. The influence of a thickness variation on the reflectivity variation is very small for the QW coating according to the invention, and thus acceptable for manufacturing, whereas the thickness variation for a prior art coating is significant.

As can be seen in FIG. 9, the influence of the refractive index deviation of the QW coating according to the invention is comparable to that of a prior art coating. Altogether, it contributes less to a deviation of the reflectivity than a thickness variation does.

As is clearly visible from FIG. 10, prior art standard coating reflectivity is strongly dependent on wavelength variation, whereas the QW coating according to the present invention is absolutely stable with regard to wavelength variations in the plotted range.

For a standard, non-QW coating with 1% reflectivity as used before, the reflectivity variation is about +/−0.8 abs %. For the QW coating according to the invention, the requirement for the maximal reflectance variation is as follows:

| Reflectivity Variation |
| --- |
| +0.21–0.01 abs % |

The asymmetry in the reflectivity variation is explained in FIG. 8. A thickness deviation from the QW thickness always leads to a positive change in the reflectivity. Thus for a 1% reflectivity QW coating, a thickness variation of 50 Å leads to change in reflectivity of +0.2 abs %.

This leads to the following requirements for thickness, index and wavelength:

| Thickness variation | Index variation | Wavelength variation |
| --- | --- | --- |
| +/−50 Å | +0.005/−0.005 | +/−10 nm |

These requirements concern the homogeneity and the run-to-run reproducibility of the coating process described below.

For PE-CVD $SiN_x$:H layers, the material properties are mainly governed by the crystal structure. This microstructure is characterized by the configurations and density of various bonds (Si—N, Si—Si, Si—H, N—N and N—H) which were formed during the deposition process as a result of chemical reactions of the precursor gases silane ($SiH_4$), ammonia ($NH_3$) and nitrogen ($N_2$). This chemical reaction and the resulting material properties of the $SiN_x$:H layers are mainly governed by the following process parameters:

[$SiH_4$]:[$NH_3$]:[$N_2$] ratios in the plasma;
total flux of the precursor gases;
plasma power;
pressure within the chamber;

substrate temperature; and addition of other precursor gases, e.g. hydrogen.

As mentioned above, the refractive index depends not only on the Si/N ratio in the $SiN_x$:H layer, but shows also variations when the structure of the $SiN_x$:H layer changes.

The microstructure of the $SiN_x$:H layer is believed to be complex and inhomogeneous. During the deposition process the molecules of the precursor gases silane ($SiH_4$), ammonia ($NH_3$), and nitrogen ($N_2$) are cracked into radical molecules. The nature of these radicals as well as their incorporation into the $SiN_x$:H layer depends on the deposition conditions mentioned above. Low plasma power, e.g., will lead to thermally unstable Si—$H_3$ configurations, and low temperature will result in nitrogen-free Si—H clusters and a porous layer.

On the other hand, high substrate temperatures and plasma powers will reduce the cluster formation, and more thermally stable Si—$H_2$ bonds will be incorporated into the layer.

Because of the complexity and the inhomogeneity of the microstructure, the refractive index of $SiN_x$:H is not only determined by the stoichiometry but also by the microstructure. However, as shown below, for a fixed set of substrate temperature, plasma power, chamber pressure, and $N_2$ flux, the refractive index is believed to be a one-to-one function of the Si/N ratio in the layer.

Detailed Description of a Process Embodiment

For the correlation between reflectivity and refractive index of the $SiN_x$:H coating a model was developed, modeling of relation between refractive index and fluxes of silane and ammonia Assuming that the index of refraction n is somewhat related to the ratio of Si to N atoms incorporated into the layer.

$$n = n\left(\frac{N_{Si}}{N_N}\right). \tag{1}$$

The theoretical derivation of the functionality obviously is very difficult. A fair assumption is to expect the index of refraction to be a smooth and steady function of $N_{Si}/N_N$.

The next complication is to estimate how many of the injected gas molecules are ionized, radicalized and accelerated towards the substrate to be incorporated into the layer. A wide variety to reactions take place in the chamber, lots of interactions on the surface can be imagined. Again, a theoretical derivation is extremely difficult.

We therefore assume that the number of Si atoms incorporated into the layer is proportional to the concentration of ionized Si—$H_x$ (x=0, 1, 2, 3) fragments in the plasma $$N_{Si} \approx n_{Si-H_x} = \zeta_{SiH_4} n_{SiH_4} \tag{2}$$

which is proportional to the $SiH_4$ flow.

The same assumption can be made for the nitrogen layer concentration. Here, the situation is more complex since two sources for N—$H_x$ (x=0, 1, 2) are available. The ionization energies of $N_2$ and $NH_3$ are different. The same is true for their sticking coefficient. Therefore, we write $$N_N \approx \zeta_{N_2} n_{N_2} + \zeta_{NH_3} n_{NH_3} \tag{3}$$

As a result we can write $$\frac{N_{Si}}{N_N} \approx \frac{\zeta_{SiH_4} \cdot n_{SiH_4}}{\zeta_{N_2} \cdot n_{N_2} + \zeta_{NH_3} \cdot n_{NH_3}} \equiv \left[\frac{Si}{N}\right] \tag{4}$$

Here, the step between the process parameters and the (unknown) ratio of silicon and nitrogen atoms is made. The coefficients $\zeta_{SiH_4}$, $\zeta_{N_2}$ and $\zeta_{NH_3}$ contain all plasma-related characteristics like ionization cross sections, recombination cross sections etc. We further assume that this value is constant or is only little changing with the gas mixture as long as the substrate temperature, the power density and the pressure is set constant. This is a fair assumption since only 10–35% of the gas composition is consisting of reactive gases and the vast majority of the gas particles in the plasma is helium in which the silane is diluted (about 2%).

The above-described model was implemented in the following way.

In the following example, plasma power (25 W), substrate temperature (300° C.), pressure within chamber (1.4 Torr) and nitrogen flux (35 sccm) are kept constant. The refractive index n is adjusted by the fluxes of silane and ammonia. As mentioned before, the exact functionality of n with [Si/N] is unknown.

Figure 12:
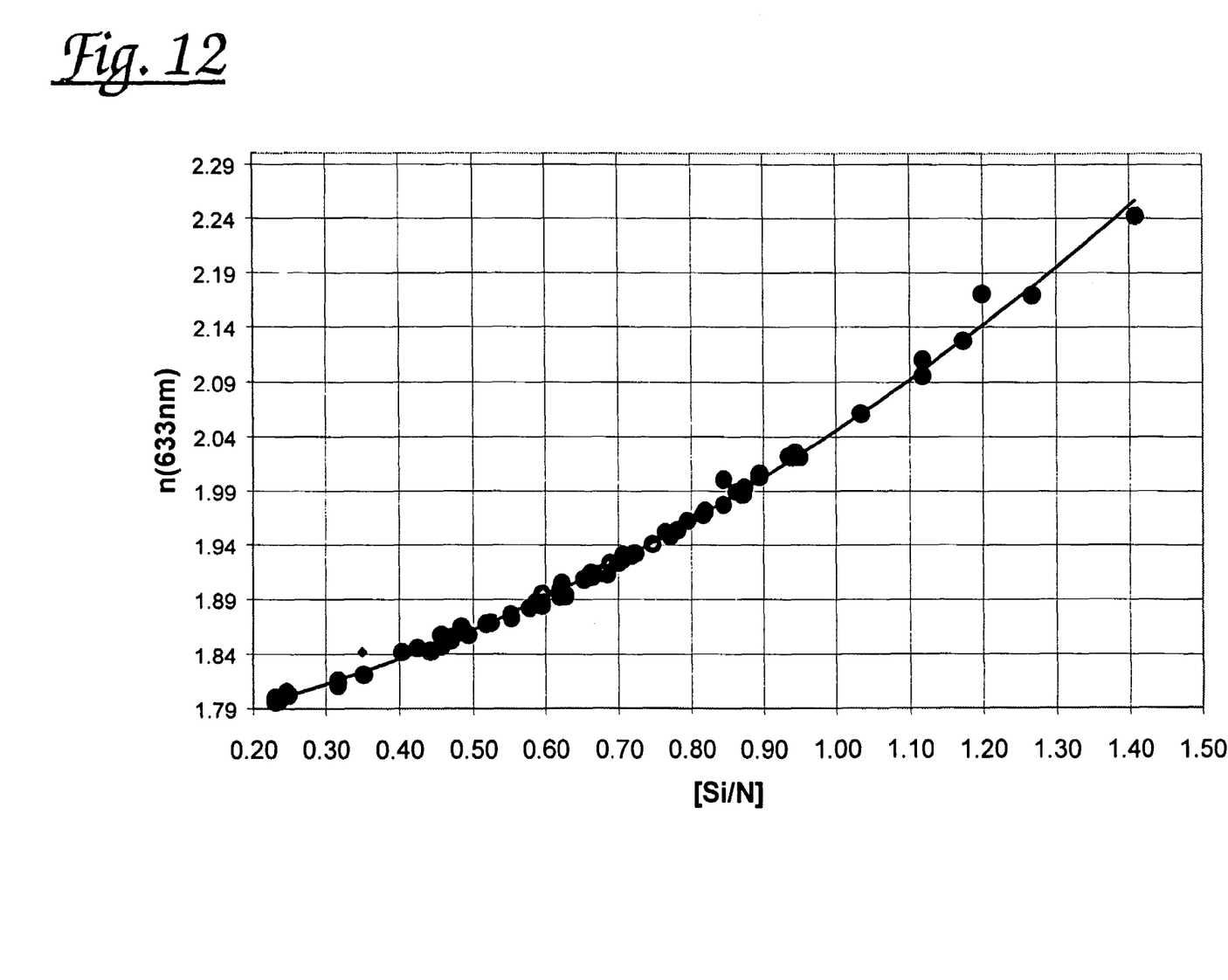
FIG. 12 shows the index of refraction measured at 633 nm as a function of the [Si/N] value in the coating.

FIG. 12 shows a graph of [Si/N] versus the refractive index measured by ellipsometry at 633 nm. For the fitting of the experimental data the following coefficients $\zeta_{SiH_4}$, $\zeta_{N_2}$ and $\zeta_{NH_3}$ were used:

$$\zeta_{SiH_4} \approx 1; \zeta_{N_2} \approx 0.12; \zeta_{NH_3} \approx 0.36 \tag{5}$$

These parameter values are shown as solid line in FIG. 12. The curve is very smooth, and for $$\left[\frac{Si}{N}\right] \approx \frac{3}{4} \tag{6}$$

$n_{633}$ is close to the value of n=1.95 (crystalline $Si_3N_4$).

On the other hand the value [Si/N], which can be calculated from of the process parameters obviously is a good measure to predict the index of refraction. We can then express $n_{633nm}$ as follows:

$$n_{633nm} = 0.1587 \cdot \left[\frac{Si}{N}\right]^2 + 0.1281 \cdot \left[\frac{Si}{N}\right] + 1.7588 \tag{7}$$

The refractive index at the emitting wavelength of the semiconductor laser can be obtained from the dispersion relation n(λ) of the refractive index.

Figure 11:
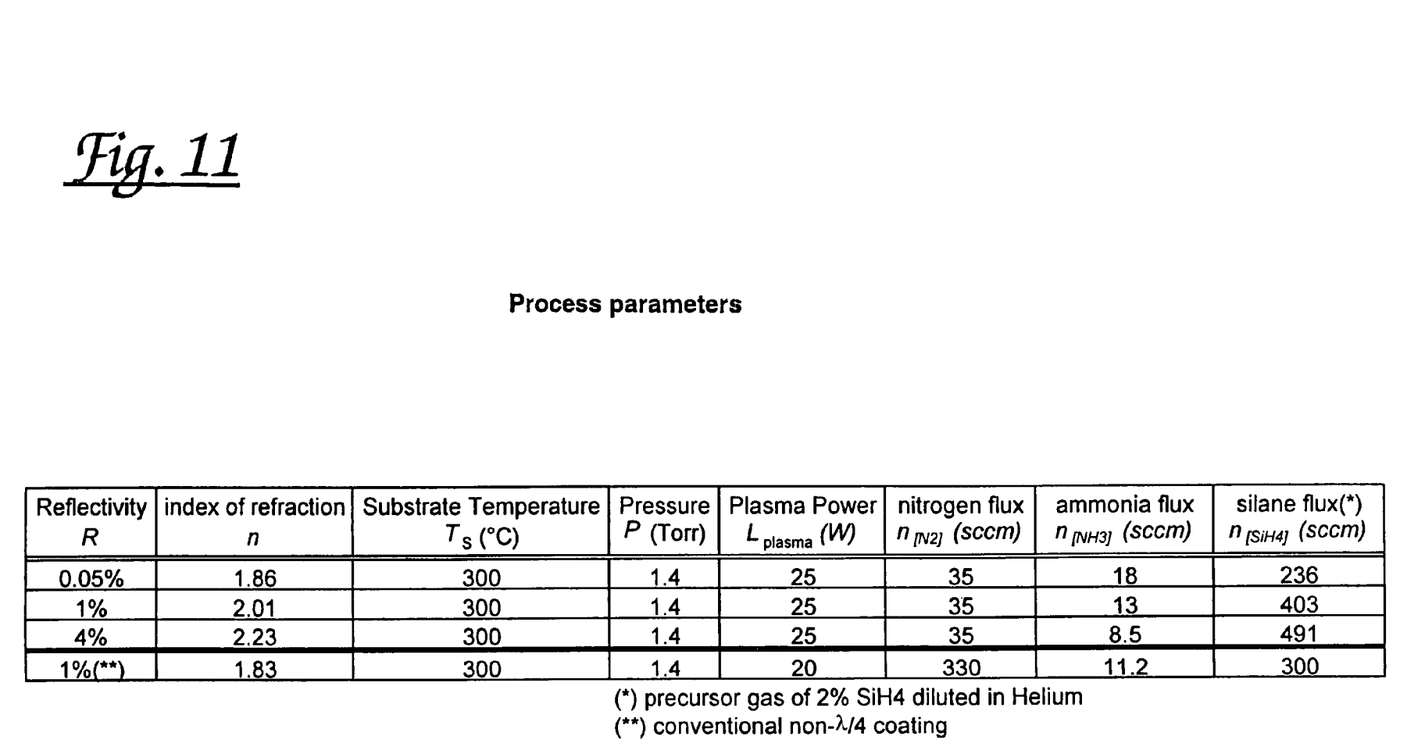
FIG. 11 is a table showing of PE-CVD process parameters for QW $SiN_x$:H coatings with (practically) 0%, 1%, and 4% reflectivity.

FIG. 11 shows a table of with PE-CVD process parameters applied for 980 nm GaAs lasers and reflectivity 0%, 1% and 4%.

Figure 13:
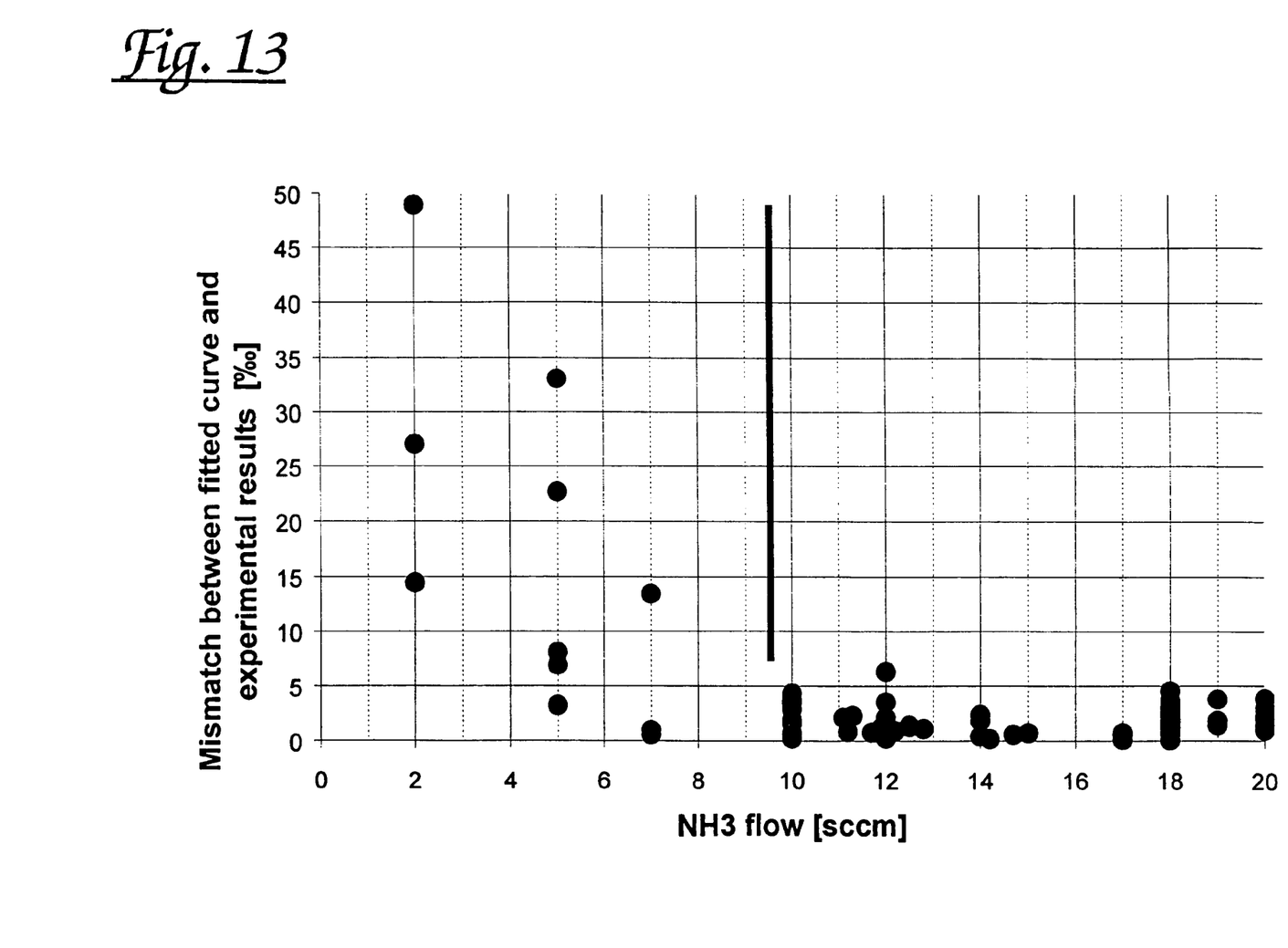
FIG. 13 shows the mismatch between experimental results and fit function as a function of the ammonia flow rate in the PE-CVD process.

FIG. 13 shows a graph of the mismatch between the experimental results and the fitted curve in FIG. 12. The mismatch is small as long as the ammonia flux is bigger than about 10 sccm. As shown in FIG. 11, this has to be taken into account when moving toward higher diffraction indexes.

A similar relationship between fluxes and refractive index of $SiN_x$:H coatings as described by the equations (5) and (7) can be obtained for different sets of nitrogen flux, substrate temperature, plasma power, and/or chamber pressure.

As described above, changing the diffraction index leads in general to a different Si/N ratio of the $SiN_x$:H dielectric.

This change of the structure potentially influences the absorption coefficients as well as the thermal stability of the coating material.

Especially the increase in Si—Si bonds, which is difficult to avoid when moving to higher refractive indexes, might reduce the thermal stability of the coating as it might lead to the formation of nitrogen-free Si:H clusters which are thermaly unstable and which absorb light at 980 nm.

The requirements for a suitable new process according to the invention to achieve the desired absorption and thermal stability at 980 nm were set as follows:

The change in thickness and refractive index introduced by annealing (45 min at 410° C.) in the novel QW $SiN_x$:H layers must be smaller than in "standard" $SiN_x$:H layers annealed in the same way (45 min at 410° C.).

The absorption of both QW and standard coatings is too small to be determined. However, AFM studies of QW coatings on lasers revealed dimples in the coating which are probably related to the densification of the coating material during laser operation. This densification is believed to be a result of (a) the absorption of emitting light, and (b) the thermal instability of the coating. This observation lead to the following third material stability criterion:

AFM investigations of QW-coated 980 nm lasers of type G06d (1% reflectivity) operated at 700 mA and 85° C. during 3000 h showed no dimples in the front coating.

Since a high Si—N ratio means a high probability of Si-Si bonds, the [Si]/[N] ratio should be kept low. Based on material tests the upper limit for the ratio was set to [Si]/[N]=1.5.

Elastic recoil detection analysis and infrared spectroscopy measurements showed that there is no correlation between the total amount of hydrogen in a PE-CVD $SiN_x$:H coating according to the invention and the thermal stability of the coating.

The stability of the material appears to depend on the type of silicon-hydrogen and nitrogen-hydrogen bonds. Therefore no requirement was set for the total hydrogen concentration.

For all performed device tests, electrostatic discharge (ESD), pulsed time to COD measurements, bar test results, degradation behavior, the QW-coated lasers behave equally or better than the lasers with a conventional non-QW coating.

For the PE-CVD process, the same requirements as for the standard coating are valid. Essentially, these requirements are:

The standard deviation for one batch of lasers should be in the same order of magnitude as for the standard coating:
+/−30 Å from the target thickness and
+/−0.001 for the refractive index over the area with one deposition run.

The requirements for the run-to-run reproducibility, carried out on plain GaAs wafers, are the same as for the standard coating. The deviation from the target values should be:
less than 20 Å for the layer thickness, and
less than 0.004 for the refractive index.

The throughput should be the same as for the standard coating. Since there are multiple coating tools, there is no shortage due to different processes expected.

The QW coating process for n=2.02 is a modification of the standard process. The parameters for the processes are shown in FIG. 11.

An increase of the plasma power leads to a higher density and therefore to a better material stability. Reliability data of a QW-PS coated lasers (see below) indicate that the increase of the plasma power from 20 to 25 W results in no significant damage of the facet.

For a higher refractive index, the $[SiH_4]/([NH_3]+[N_2])$ flux ratio has to be increased. Material tests have shown that an increase of the $[NH_3]/[N_2]$ flux ratio improves the material stability of the $SiN_x$:H layers. However, some $N_2$ is needed in the plasma for homogeneity reasons. Therefore, the $N_2$ flux was reduced to 35 sccm.

For the investigation of the material properties and stability, $SiN_x$:H layers deposited on GaAs and Si substrates by
a standard process,
an "old" QW process, and
the new QW process according to the invention were annealed at 410° C. during 1 min, 15 min, and 45 min. The following parameters and features of annealed and not annealed samples were compared.

Thickness and Refractive Index:
The change of thickness and refractive index induced by the annealing steps is smaller for the new PS QW coating than for the standard coating.

Stoichiometry and Density:
Compared to "old", less stable versions of QW coatings (e.g. coating type "C", plasma power 20 W), the new PS QW process results in less Si, less Si—Si bonds, and achieves a higher density.

Hydrogen Content:
The hydrogen loss in the new PS QW coating induced by the annealing step is comparable to the standard coating and smaller than in "old" QW processes.

Si—H and N—H Peaks of Infrared Spectra:
The Si—H peaks in the spectra belonging to QW coatings with an improved material stabilty are centered at about 2180 $cm^{-1}$, which shows that the majority of the Si—H bonds are stable Si—$H_2$ bonds. This indicates the absence of N-free Si—H clusters. These clusters are thermally less stable, and they are and possibly responsible for the absorption at 980 nm as observed in less stable in "old" QW mirrors.

Stress:
Contrary to the tensile-stressed standard coating, the stress in the new QW $SiN_x$:H coating is compressive. Test data indicate that this difference in stress behavior has no negative impact on the reliability of the lasers. The change in stress due to annealing is about the same for the QW and the standard coating. Furthermore, several stress tests exhibit an about 20–30% lower fit rate for the QW coating.

In device tests, no coating-related effects within all experiments concerning threshold current and front efficiency were detected beside the fact that a higher front facet reflectivity results in a lower threshold current and a lower front efficiency.

Front-to-back (FB) ratio is more stable (lower standard deviation) in comparison to standard $SiN_x$:H coating with the exception of a few QW-coated bars which show a strong scattering of the FB ratio.

Electrostatic Discharge (ESD) test (+9 kV to −9 kV) shows no significant difference between the standard $SiN_x$:H and the novel QW $SiN_x$:H-coated lasers.

On the pulsed-time-to-COD laser test under the conditions mentioned above, i.e. at −40 C, with 2.5 A pulses of 5 s and 4% duty cycle, all observed fails were CODs, i.e. the pulsed laser test stresses specifically the front facet of the laser diode. The average fail time was lower for standard-coated lasers in comparison to QW-coated lasers.

Degradation with respect to threshold current and efficiency during lifetime (700 mA, 85° C.) on lifetime for QW-coated chips was observed to be lower than or in the order of standard coated chips To summarize, all tests show a clear advantage and improved material stability of the QW coating process according to the present invention.

Apart from the process control used for the standard coating, the following extra control steps may be introduced:

Control of Stoichiometry:

The composition of "pre-run" $SiN_x$:H layers will be measured by EDX (3 kV, 100 s). The Si/N ratio should exceed the value of 1.5 only in special cases, usually it should be between about 0.3 and 1.5.

Determination of Etch Rates:

The etch rates of "pre-run" $SiN_x$:H layers in 1:49 buffered HF solution should not be higher than 50 nm/min.

With these additional steps in the manufacturing process, further improvements of the resulting PS QW laser facet coating may be achieved.

Further modifications will readily occur to a person skilled in the art and the invention is therefore not limited to the specific embodiments, details, and steps shown and described herein before. Modifications may be made without departing from the spirit and scope of the general inventive concepts as defined in the appended claims.

The invention claimed is:

1. A semiconductor laser emitting at a given wavelength with a coating on its emitting facet, wherein
said coating comprises an essentially amorphous $SiN_x$:H layer, x being a real number, with a predetermined thickness and a predetermined refractive index,
said thickness being determined by said laser's wavelength,
said refractive index being essentially determined by the Si/N ratio in said $SiN_x$:H layer,
the Si/N ratio of the $SiN_x$:H layer is selected between approximately 0.3 and approximately 1.5.

2. The semiconductor laser according to claim 1, wherein the refractive index of the $SiN_x$:H layer is selected in relation to the refractive index of the laser facet.

3. The semiconductor laser according to claim 1, wherein the thickness, in particular optical thickness, of the coating is selected to be one quarter of the laser's wavelength.

4. The semiconductor laser according to claim 1, wherein the refractive index of the coating is tuned during the manufacturing process of the $SiN_x$:H layer, essentially by controlling its Si/N ratio and/or its microstructure.

5. The semiconductor laser according to claim 1, wherein the coating is a multi-layer coating including at least one essentially amorphous $SiN_x$:H layer.

6. The semiconductor laser according to claim 1, wherein the coating consists of or comprises an essentially homogeneous $SiN_x$:H layer.

7. The semiconductor laser according to claim 6, wherein the ratio of Si to N of the $SiN_x$:H layer is tuned to effect a refractive index of the coating close to $\sqrt{n_{eff}}$, wherein $n_{eff}$ is the effective refractive index of the laser facet.

8. The semiconductor laser according to claim 6, wherein the refractive index of the SiNx:H layer is tuned to achieve a refractive index of the coating between approximately 1.6 and approximately 2.4.

9. The semiconductor laser according to claim 6, wherein the refractive index of the SiNx:H layer is tuned to achieve a refractive index of the coating between 1.79 and 2.24.

10. The semiconductor laser according to claim 6, wherein
the $SiN_x$:H layer is located adjacent the laser facet and its refractive index is tuned to effect a reflectivity at the laser facet of approximately zero.

11. The semiconductor laser according to claim 6, wherein
the coating constitutes a phase-shifting QW coating.

12. The semiconductor laser according to claim 6, wherein
the Si/N ratio of the $SiN_x$:H layer is selected between approximately 0.3 and approximately 1.5.

13. The semiconductor laser according to claim 6, wherein
the optical thickness of the $SiN_x$:H layer is selected to be one quarter of the laser's wavelength.

14. A coating on a facet of a semiconductor laser emitting at a given wavelength, said laser having an external cavity, wherein
said coating comprises or consists of an essentially amorphous $SiN_x$:H layer, wherein x is a real number,
said $SiN_x$:H layer having
a thickness determined by said laser's wavelength,
a refractive index essentially determined by the Si/N ratio in said SiNx:H layer, and
an Si/N ratio selected between approximately 0.3 and approximately 1.5.

15. The coating according to claim 14, wherein
the refractive index of the $SiN_x$:H layer is further determined by the microstructure of said layer.

16. The coating according to claim 15, wherein
the Si/N ratio and/or the microstructure of the $SiN_x$:H layer is selected to produce a refractive index of said coating close to $\sqrt{n_{eff}}$, $n_{eff}$ being the effective refractive index of the laser facet.

17. The coating according to claim 14, wherein
the optical thickness of the $SiN_x$:H layer is selected to be one quarter of the laser's wavelength.

* * * * *